(12) United States Patent
Chyn et al.

(10) Patent No.: US 7,916,484 B2
(45) Date of Patent: Mar. 29, 2011

(54) HEAT SINK HAVING ENHANCED HEAT DISSIPATION CAPACITY

(76) Inventors: Wen-Long Chyn, Taipei Hsien (TW); Te-Ching Hsu, Kaohsiung (TW)

( * ) Notice: Subject to any disclaimer, the term of this patent is extended or adjusted under 35 U.S.C. 154(b) by 536 days.

(21) Appl. No.: 11/939,579

(22) Filed: Nov. 14, 2007

(65) Prior Publication Data
US 2009/0122490 A1 May 14, 2009

(51) Int. Cl.
*H05K 7/20* (2006.01)
(52) U.S. Cl. ........ 361/710; 361/704; 361/709; 174/521; 428/76; 428/698
(58) Field of Classification Search .................. 361/699, 361/700, 704, 705, 710, 718, 720
See application file for complete search history.

(56) References Cited

U.S. PATENT DOCUMENTS

| | | | | |
|---|---|---|---|---|
| 5,001,299 A * | 3/1991 | Hingorany | .................. | 174/521 |
| 5,402,004 A * | 3/1995 | Ozmat | .......................... | 257/717 |
| 5,986,885 A * | 11/1999 | Wyland | .......................... | 361/704 |
| 6,191,944 B1 * | 2/2001 | Hammel et al. | .............. | 361/699 |
| 7,447,029 B2 * | 11/2008 | Lai et al. | ....................... | 361/700 |
| 2003/0024611 A1 * | 2/2003 | Cornie et al. | ................. | 148/420 |
| 2006/0011336 A1 * | 1/2006 | Frul | .............................. | 165/185 |

* cited by examiner

*Primary Examiner* — Boris L. Chervinsky
*Assistant Examiner* — Courtney Smith
(74) *Attorney, Agent, or Firm* — Alan Kamrath; Kamrath & Associates PA

(57) ABSTRACT

A heat sink includes a metallic heat conducting layer, a non-metallic heatsink layer combined with the metallic heat conducting layer and having a porous structure, and a hollow receiving space defined between the metallic heat conducting layer and the non-metallic heatsink layer. Thus, the heat produced by a heat source is conducted quickly and distributed evenly on the metallic heat conducting layer to form an evenly heat conducting effect, while the hollow receiving space has a heat convection effect to quickly transfer the heat on the metallic heat conducting layer to the non-metallic heatsink layer which produces a heatsink effect to dissipate the heat so that the heat is dissipated quickly by provision of the metallic heat conducting layer, the hollow receiving space and the non-metallic heatsink layer.

18 Claims, 7 Drawing Sheets

HEAT SINK HAVING ENHANCED HEAT DISSIPATION CAPACITY

BACKGROUND OF THE INVENTION

1. Field of the Invention

The present invention relates to a heat sink and, more particularly, to a heat sink for an electronic device, such as a CPU (central processing unit), LED (light emitting diode), IC (integrated circuit), rectifier, resistor, capacitor, inductor, and the like.

2. Description of the Related Art

An electronic device or element, such as the CPU (central processing unit), LED (light emitting diode), IC (integrated circuit), rectifier, resistor, capacitor, inductor, and the like, is a heat source and easily produces a high temperature during operation, so that it is necessary to provide a heat sink to carry away the heat produced by the electronic device or element so as to achieve a heat dissipation effect. A conventional heat sink generally comprises a heatsink element, such as a metallic heatsink fin, a heat conductive tube, a chill enabling chip, a heat dissipation board, a cooling fan and the like, so as to achieve a heat dissipation effect. However, the conventional heat sink cannot dissipate the heat from the heat source exactly and quickly, thereby greatly decreasing the heat dissipation efficiency. In addition, the conventional heat sink has a very complicated construction, thereby increasing the costs of fabrication.

BRIEF SUMMARY OF THE INVENTION

In accordance with the present invention, there is provided a heat sink, comprising a metallic heat conducting layer, a non-metallic heatsink layer combined with the metallic heat conducting layer and having a porous structure, and a hollow receiving space defined between the metallic heat conducting layer and the non-metallic heatsink layer.

The primary objective of the present invention is to provide a heat sink having an enhanced heat dissipation capacity to dissipate a heat from a heat source quickly.

Another objective of the present invention is to provide a heat sink, wherein the heat produced by the heat source is conducted quickly and distributed evenly on the metallic heat conducting layer to form an evenly heat conducting effect, while the hollow receiving space has a heat convection effect to quickly transfer the heat on the metallic heat conducting layer to the non-metallic heatsink layer which produces a heatsink effect to dissipate the heat so that the heat produced by the heat source is dissipated quickly by provision of the metallic heat conducting layer, the hollow receiving space and the non-metallic heatsink layer.

Further benefits and advantages of the present invention will become apparent after a careful reading of the detailed description with appropriate reference to the accompanying drawings.

BRIEF DESCRIPTION OF THE SEVERAL VIEWS OF THE DRAWING(S)

DETAILED DESCRIPTION OF THE INVENTION

Figure 1:
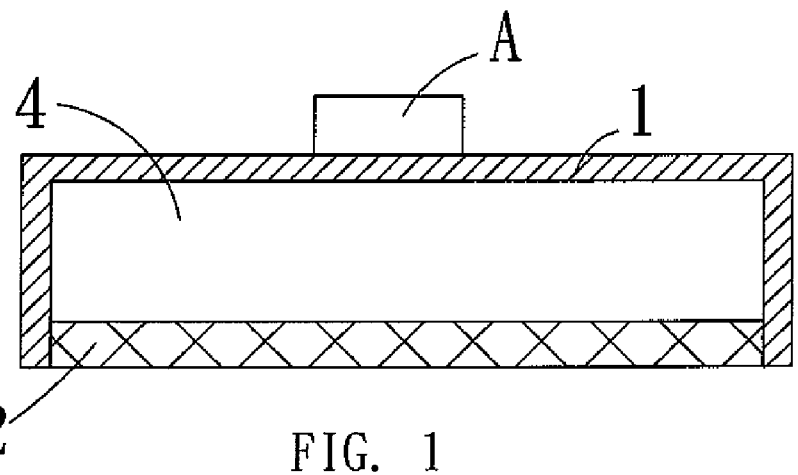
FIG. 1 is a front cross-sectional assembly view of a heat sink in accordance with the preferred embodiment of the present invention.

Referring to the drawings and initially to FIG. 1, a heat sink in accordance with the preferred embodiment of the present invention comprises a metallic heat conducting layer 1, a non-metallic heatsink layer 2 combined with the metallic heat conducting layer 1, and a hollow receiving space 4 defined between the metallic heat conducting layer 1 and the non-metallic heatsink layer 2.

The metallic heat conducting layer 1 is made of a metal having greater heat conductivity, such as gold, silver, copper, iron, aluminum, cobalt, nickel, zinc, titanium, manganese and the like. The non-metallic heatsink layer 2 is made of non-metallic powder having greater heat conductivity, such as $Al_2O_3$, $Zr_2O$, AlN, SiN, BN, WC, SiC, C, ReSiC and the like. The non-metallic heatsink layer 2 has a porous structure so that the air contained in the hollow receiving space 4 can pass through the non-metallic heatsink layer 2 to produce a heat convection effect.

As shown in FIG. 1, the hollow receiving space 4 is formed by the metallic heat conducting layer 1. The metallic heat conducting layer 1 has a hollow inside to define the hollow receiving space 4 and has an open end for mounting the non-metallic heatsink layer 2. Thus, the hollow receiving space 4 has an open end sealed by the non-metallic heatsink layer 2.

When in use, a heat source (A) is mounted on the metallic heat conducting layer 1. Thus, the heat produced by the heat source (A) is conducted quickly and distributed evenly on the metallic heat conducting layer 1 to form an evenly heat conducting effect. At the same time, the hollow receiving space 4 has a heat convection effect to quickly transfer the heat on the metallic heat conducting layer 1 to the non-metallic heatsink layer 2 which produces a heatsink effect to dissipate the heat so that the heat produced by the heat source (A) is dissipated quickly by provision of the metallic heat conducting layer 1, the hollow receiving space 4 and the non-metallic heatsink layer 2.

Figure 2:
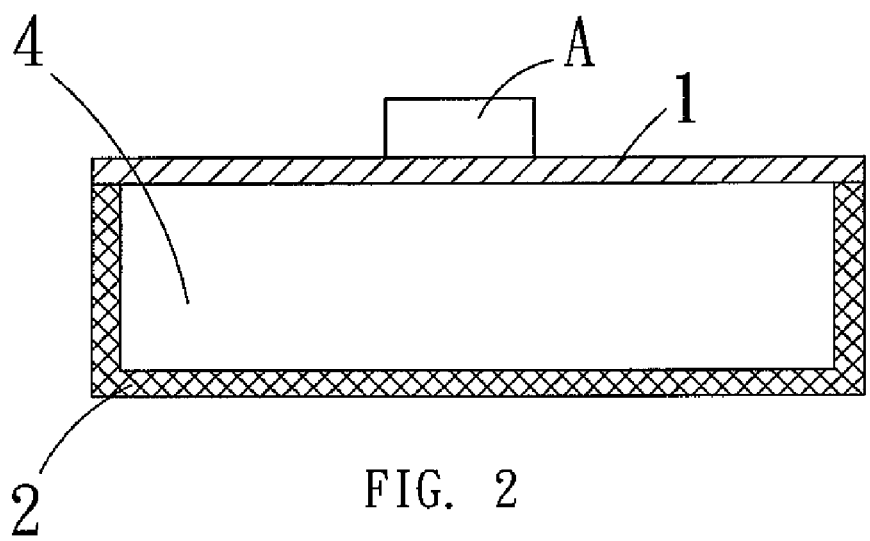
FIG. 2 is a front cross-sectional assembly view of a heat sink in accordance with another preferred embodiment of the present invention.

As shown in FIG. 2, the hollow receiving space 4 is formed by the non-metallic heatsink layer 2. The non-metallic heatsink layer 2 has a hollow inside to define the hollow receiving space 4 and has an open end for mounting the metallic heat conducting layer 1. Thus, the hollow receiving space 4 has an open end sealed by the metallic heat conducting layer 1.

Figure 3:
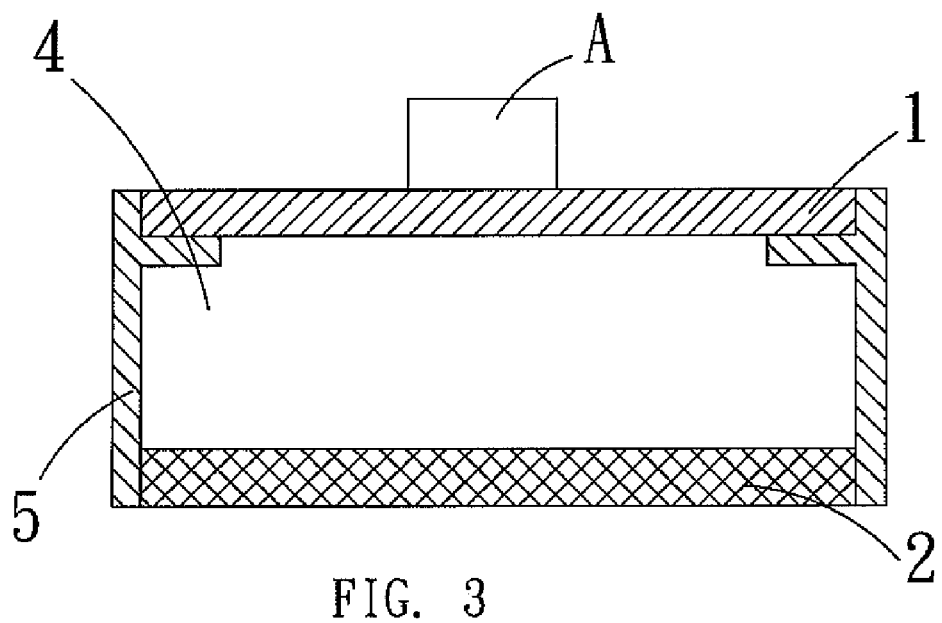
FIG. 3 is a front cross-sectional assembly view of a heat sink in accordance with another preferred embodiment of the present invention.

Referring to FIG. 3, the heat sink further comprises a packing layer 5 mounted between the metallic heat conducting layer 1 and the non-metallic heatsink layer 2, wherein the hollow receiving space 4 is formed by the packing layer 5. The packing layer 5 has a hollow inside to define the hollow receiving space 4 and has an open first end for mounting the metallic heat conducting layer 1 and an open second end for mounting the non-metallic heatsink layer 2. Thus, the hollow receiving space 4 has two open ends sealed by the metallic heat conducting layer 1 and the non-metallic heatsink layer 2 respectively.

In fabrication, the non-metallic heatsink layer 2 is made by the steps of: preparing material, rolling press kneading, extruding, elongating and drying. In the step of preparing material, non-metallic powders (such as $Al_2O_3$, $Zr_2O$, AlN, SiN, BN, WC, SiC, C, ReSiC and the like) having greater heat conductivity are prepared. The non-metallic powders have different diameters ranged between 20 μm and 200 μm. A binder (such as silicon colloid, aluminum colloid, zirconium colloid, and the like) having a determined proportion, and a plasticizer (such as starch, lignin, sodium lignosulfonate lignin, calcium lignosulfonate lignin, methyl cellulose and the like) having a determined proportion are added into the non-metallic powders. In addition, metallic powders (such as gold, silver, copper, iron, aluminum, cobalt, nickel, zinc, titanium, manganese and the like) having greater heat conductivity can be added into the non-metallic powders according to the requirement. Thus, the metallic powders and the non-metallic powders are mixed to form composite powders having different diameters ranged between 50 μm and 500 μm to enhance the heat dissipation capacity. In the step of rolling press kneading, the non-metallic powders (or the composite powders of the non-metallic powders and the metallic powders) having greater heat conductivity, the binder and the plasticizer are treated by a rolling press kneading process so that the surface of each of the powders has a layer of evenly distributed binder and plasticizer. In the step of extruding, the powders are treated by a vacuum extruding process so that the powders are extruded to form a blank having a sheet shape. In the step of elongating, the blank is treated by an elongating process so that the blank has a uniform density. In the step of drying, the blank is dried to form the non-metallic heatsink layer 2. Thus, the non-metallic heatsink layer 2 has a high porous structure and contains non-metallic powders having greater heat conductivity, wherein the non-metallic heatsink layer 2 has a porosity ranged between 20% and 80%, and the non-metallic powders have different diameters ranged between 20 μm and 200 μm.

Alternatively, the step of extruding and the step of elongating are replaced by a step of die press molding (such as stamping molding, uniform pressure molding, vibration press molding and the like). In the step of die press molding, the powders are pressed to form a blank having a predetermined shape, such as a sheet shape or a matrix shape, and the blank is directly formed with the hollow receiving space 4. Then, the blank is dried to form the non-metallic heatsink layer 2 having a porous structure.

Figure 4:
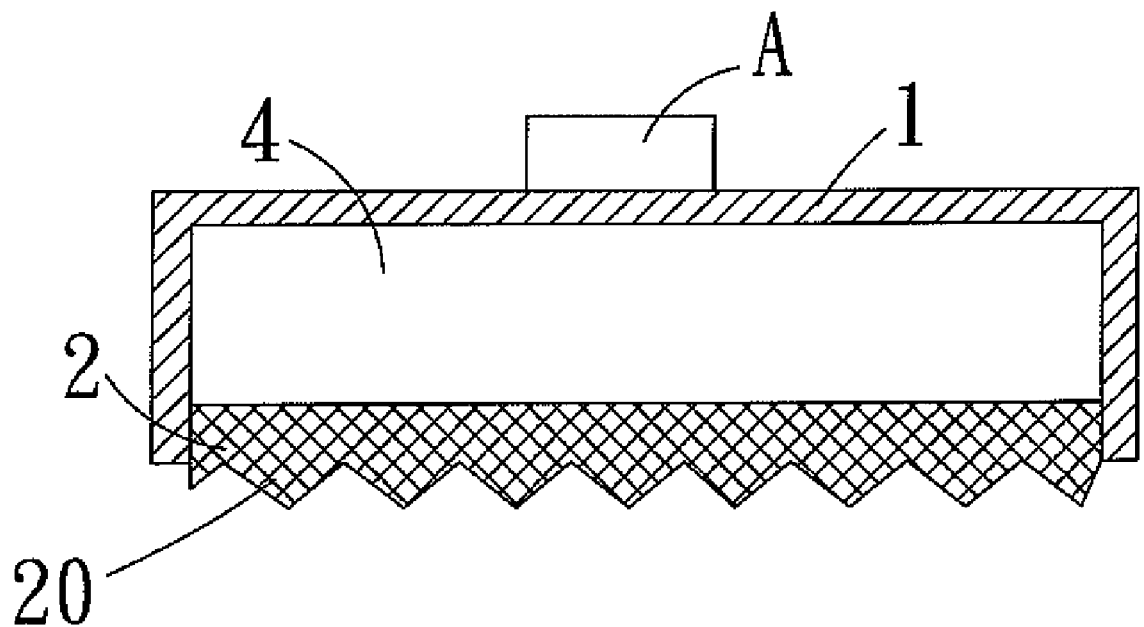
FIG. 4 is a front cross-sectional assembly view of a heat sink in accordance with another preferred embodiment of the present invention.
Figure 5:
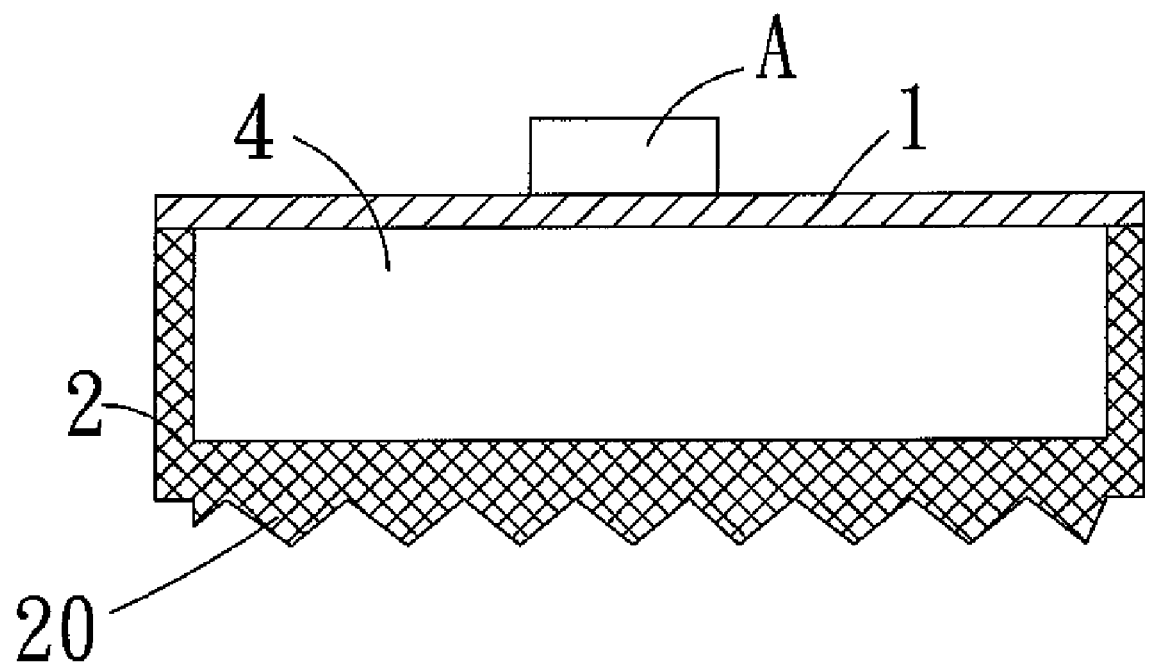
FIG. 5 is a front cross-sectional assembly view of a heat sink in accordance with another preferred embodiment of the present invention.

As shown in FIGS. 4 and 5, the non-metallic heatsink layer 2 has a three-dimensional heat dissipation face 20 which has a predetermined shape and has a matrix arrangement. Thus, the non-metallic heatsink layer 2 has a larger surface area by provision of the three-dimensional heat dissipation face 20 to enhance the heat dissipation effect.

Figure 6:
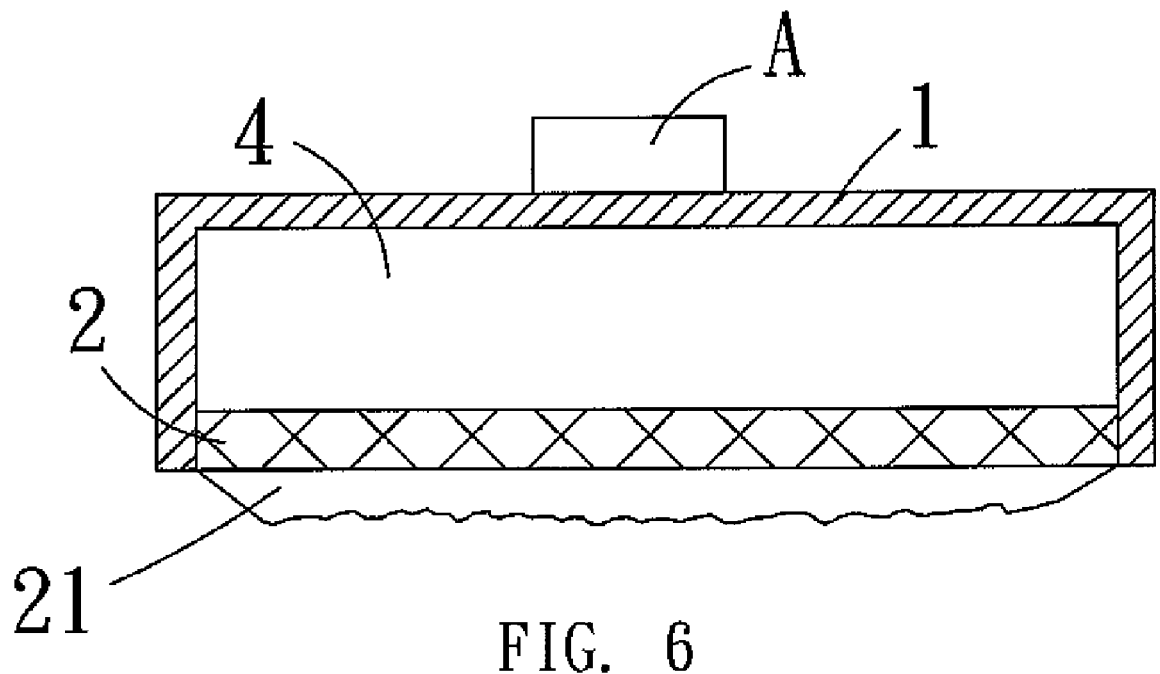
FIG. 6 is a front cross-sectional assembly view of a heat sink in accordance with another preferred embodiment of the present invention.
Figure 7:
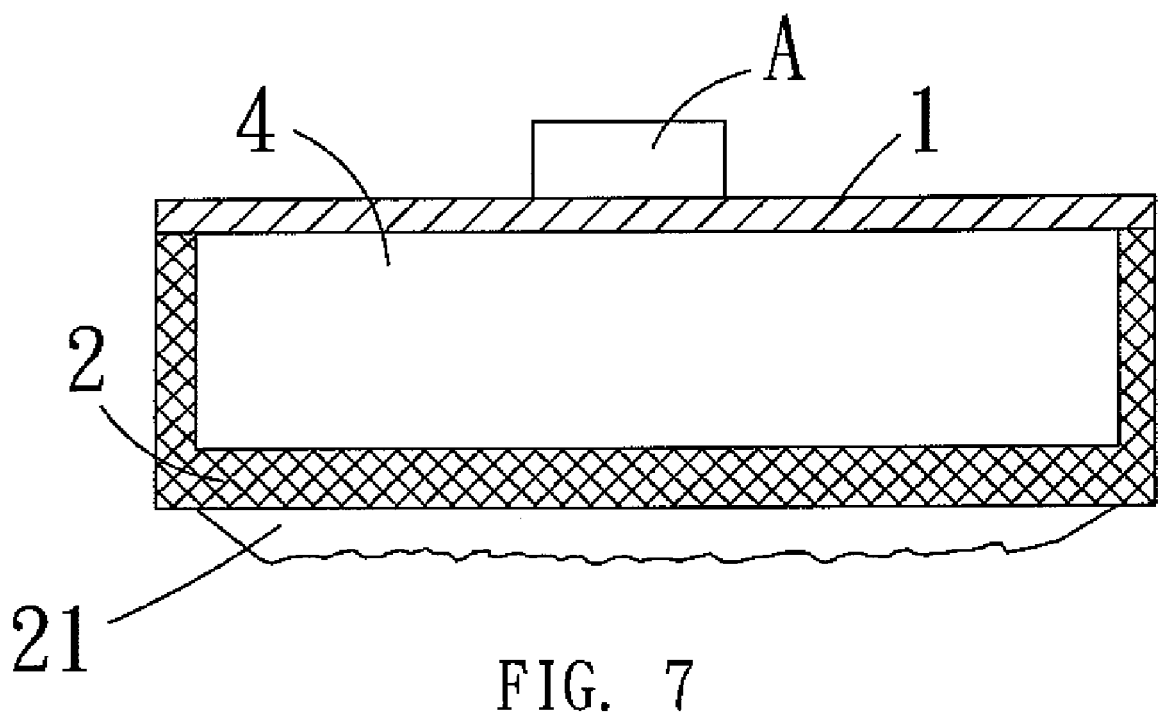
FIG. 7 is a front cross-sectional assembly view of a heat sink in accordance with another preferred embodiment of the present invention.

Referring to FIGS. 6 and 7, the heat sink further comprises a three-dimensional dot-matrix heatsink layer 21 mounted on a surface of the non-metallic heatsink layer 2 and arranged in an irregular manner. Thus, the non-metallic heatsink layer 2 has a larger surface area by provision of the three-dimensional dot-matrix heatsink layer 21 to enhance the heat dissipation effect.

In fabrication, the non-metallic heatsink layer 2 is further made by the steps of: preparing slurry, heating, spraying and sintering. The step of preparing slurry includes preparing materials the same as that of the non-metallic heatsink layer 2 and mixing and stirring the materials to form a slurry. In the step of heating, the non-metallic heatsink layer 2 (has been sintered) is pre-heated. In the step of spraying, the slurry is sprayed evenly onto the surface of the non-metallic heatsink layer 2. In the step of sintering, the non-metallic heatsink layer 2 and the slurry are sintered, so that the non-metallic heatsink layer 2 and the slurry are combined together. Thus, the particles contained in the slurry is attached to the non-metallic heatsink layer 2 so that the surface of the non-metallic heatsink layer 2 is provided with the three-dimensional dot-matrix heatsink layer 21 which has a particle shape. In such a manner, the particles of the three-dimensional dot-matrix heatsink layer 21 have different sizes and are arranged in an irregular manner.

Figure 8:
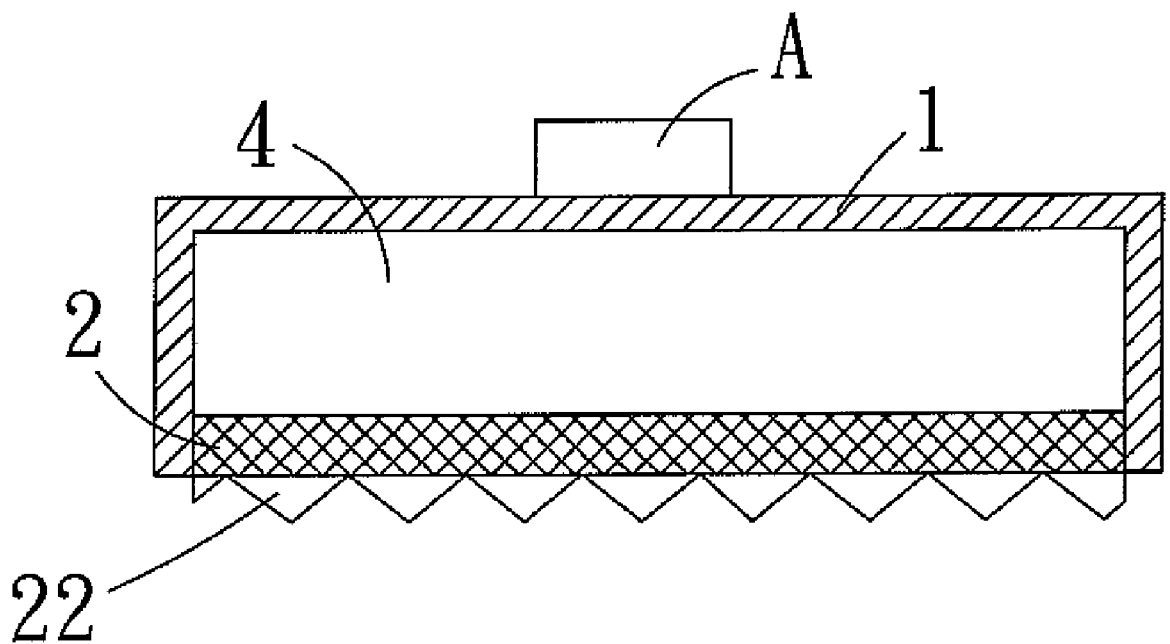
FIG. 8 is a front cross-sectional assembly view of a heat sink in accordance with another preferred embodiment of the present invention.
Figure 9:
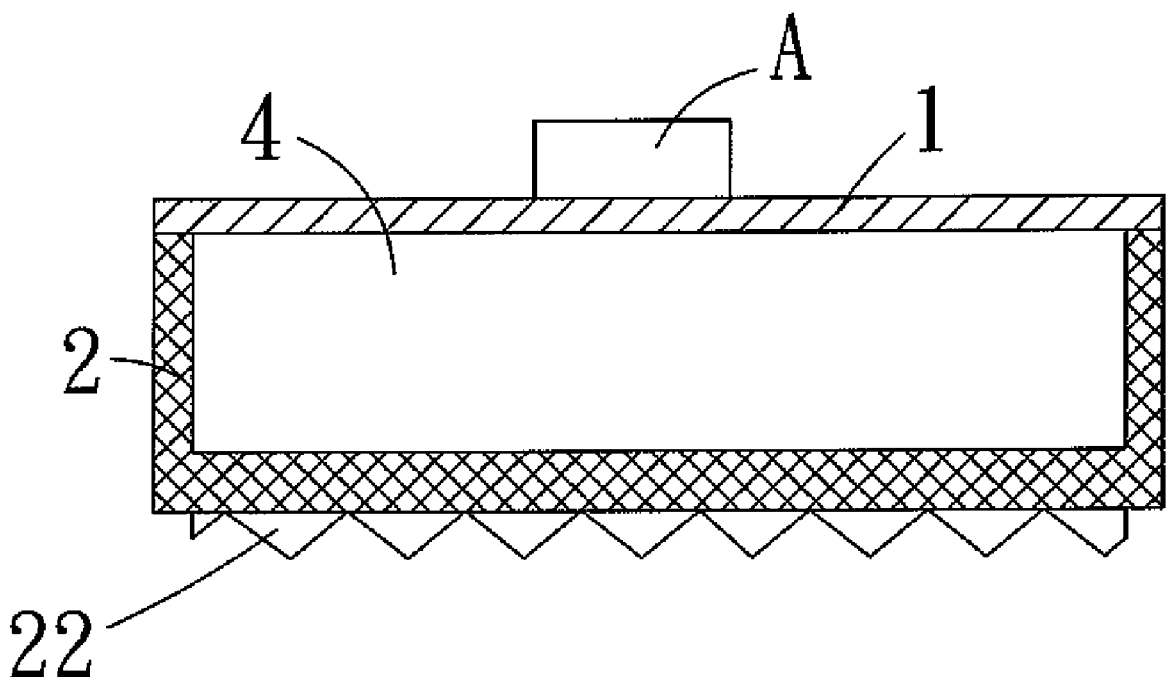
FIG. 9 is a front cross-sectional assembly view of a heat sink in accordance with another preferred embodiment of the present invention.

Referring to FIGS. 8 and 9, the heat sink further comprises a three-dimensional dot-matrix heatsink layer 22 mounted on a surface of the non-metallic heatsink layer 2 and arranged in a regular manner. Thus, the non-metallic heatsink layer 2 has a larger surface area by provision of the three-dimensional dot-matrix heatsink layer 22 to enhance the heat dissipation effect.

In fabrication, the step of spraying is replaced by a step of printing or stamping. Then, in the step of sintering, the non-metallic heatsink layer 2 and the slurry are sintered, so that the non-metallic heatsink layer 2 and the slurry are combined together. Thus, the particles contained in the slurry is attached to the non-metallic heatsink layer 2 so that the surface of the non-metallic heatsink layer 2 is provided with the three-dimensional dot-matrix heatsink layer 22. In such a manner, the particles of the three-dimensional dot-matrix heatsink layer 22 have similar sizes and are arranged in a regular manner.

Figure 10:
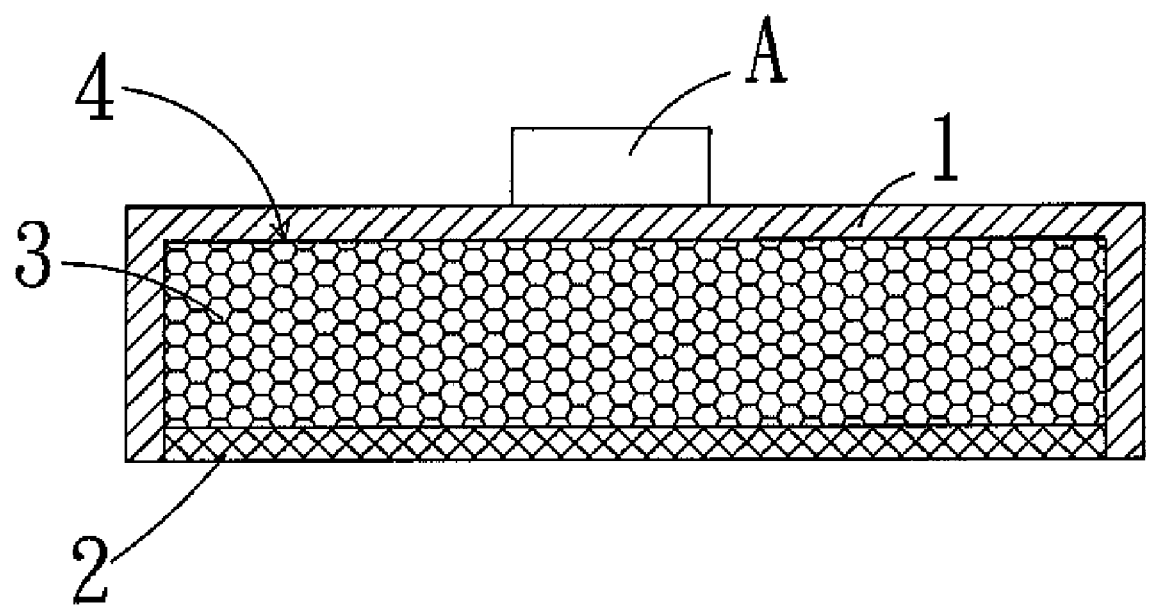
FIG. 10 is a front cross-sectional assembly view of a heat sink in accordance with another preferred embodiment of the present invention.
Figure 11:
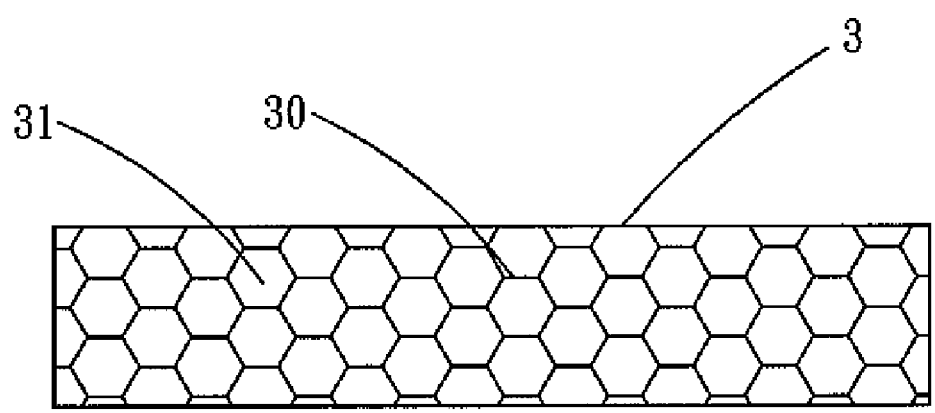
FIG. 11 is a locally enlarged view of the heat sink as shown in FIG. 10.

Referring to FIGS. 10 and 11, the heat sink further comprises a secondary non-metallic heatsink layer 3 mounted in the hollow receiving space 4 and located between the metallic heat conducting layer 1 and the non-metallic heatsink layer 2. The non-metallic heatsink layer 2 is located at a bottom of the secondary non-metallic heatsink layer 3. The secondary non-metallic heatsink layer 3 has a three-dimensional heatsink structure and includes a plurality of skeletons 30 each having a greater heat conductivity and each having an inside provided with a conduit 31. The conduits 31 of the skeletons 30 of the secondary non-metallic heatsink layer 3 are connected to each other to increase the surface area of the secondary non-metallic heatsink layer 3 so as to enhance the heat dissipation effect. Thus, when the secondary non-metallic heatsink layer 3 is mounted in the hollow receiving space 4, the conduits 31 of the skeletons 30 of the secondary non-metallic heatsink layer 3 have a greater heat convection effect so as to enhance the heat dissipation effect.

In fabrication, the secondary non-metallic heatsink layer 3 is made by the steps of: preparing slurry, attaching and sintering. The step of preparing slurry includes preparing materials the same as that of the non-metallic heatsink layer 2 and mixing and stirring the materials to form a slurry. In the step of attaching, the slurry is attached onto a molding carrier evenly. The molding carrier is made of organic material and includes a plurality of skeletons (such as sponges) and a plurality of conduits connected to each other. In the step of sintering, the molding carrier and the slurry are sintered, so that the molding carrier and the slurry are combined together to form the secondary non-metallic heatsink layer 3.

Figure 12:
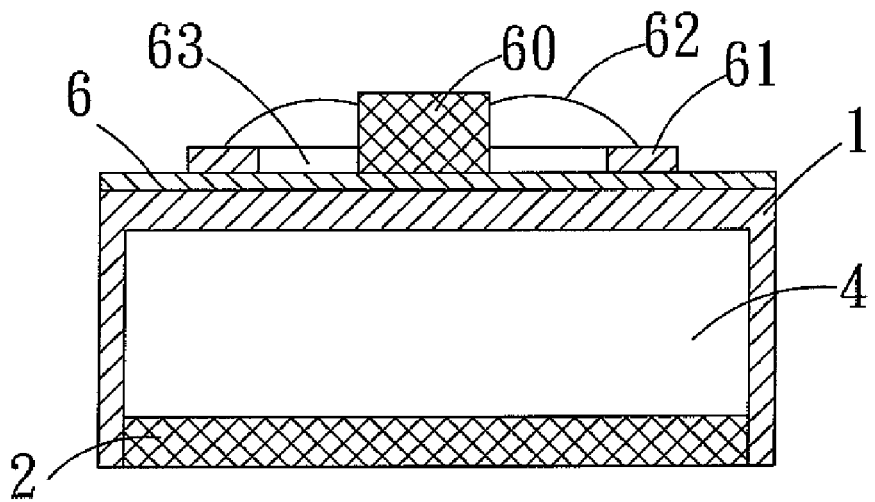
FIG. 12 is a front cross-sectional assembly view of a heat sink in accordance with another preferred embodiment of the present invention.
Figure 13:
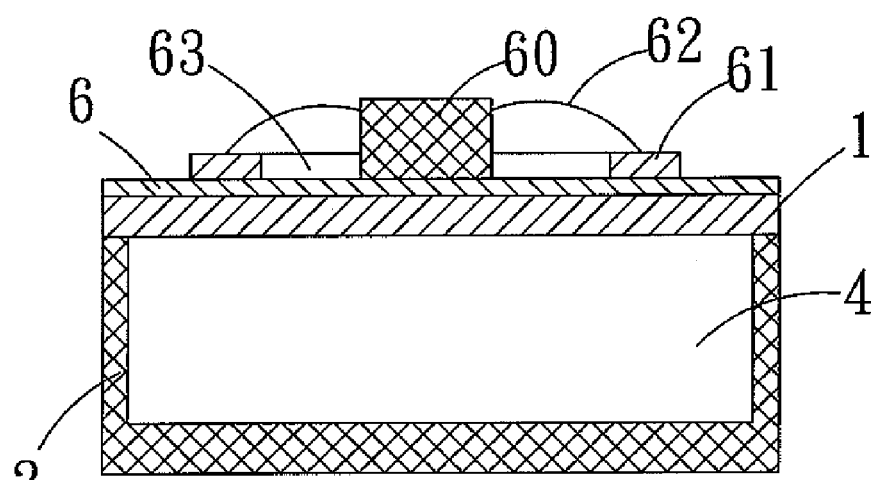
FIG. 13 is a front cross-sectional assembly view of a heat sink in accordance with another preferred embodiment of the present invention.
Figure 14:
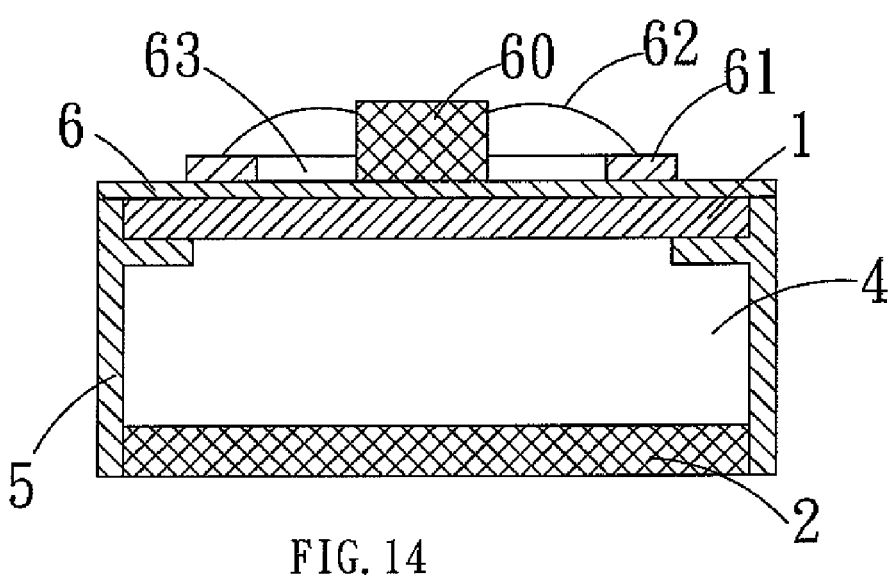
FIG. 14 is a front cross-sectional assembly view of a heat sink in accordance with another preferred embodiment of the present invention.

Referring to FIGS. 12-14, the heat sink further comprises an insulating layer 6 mounted on a surface of the metallic heat conducting layer 1, a circuit 61 mounted on the insulating layer 6, a plurality of LED (light emitting diode) crystals 60 mounted on the insulating layer 6, a plurality of conducting wires 62 connected between the circuit 61 and the LED crystals 60, and a reflective layer 63 mounted on the insulating layer 6 and located between the circuit 61 and the LED crystals 60. In such a manner, the non-metallic heatsink layer 2 has a porous structure so that the air contained in the hollow receiving space 4 can pass through the non-metallic heatsink layer 2 to produce a heat convection effect. Thus, the heat produced by the LED crystals 60 is conducted quickly and distributed evenly on the metallic heat conducting layer 1 to form an evenly heat conducting effect. At the same time, the hollow receiving space 4 has a heat convection effect to quickly transfer the heat on the metallic heat conducting layer 1 to the non-metallic heatsink layer 2 which produces a heatsink effect to dissipate the heat so that the heat produced by the LED crystals 60 is dissipated quickly by provision of the metallic heat conducting layer 1, the hollow receiving space 4 and the non-metallic heatsink layer 2. In addition, the light produced by the LED crystals 60 is reflected by the reflective layer 63 to enhance the heat dissipation efficiency.

Figure 15:
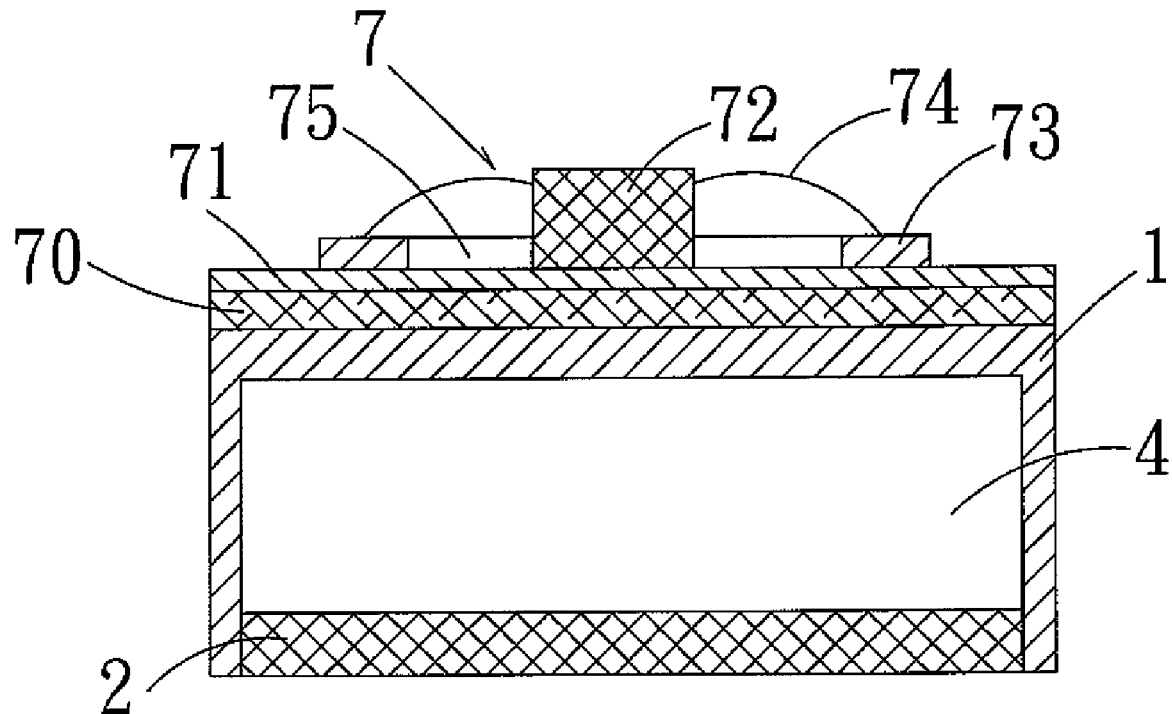
FIG. 15 is a front cross-sectional assembly view of a heat sink in accordance with another preferred embodiment of the present invention.

Referring to FIG. 15, the heat sink further comprises an LED module 7 mounted on a surface of the metallic heat conducting layer 1. The LED module 7 includes a substrate 70 mounted on the surface of the metallic heat conducting layer 1, an insulating layer 71 mounted on the substrate 70, a circuit 73 mounted on the insulating layer 71, a plurality of LED crystals 72 mounted on the insulating layer 71, a plurality of conducting wires 74 connected between the circuit 73 and the LED crystals 72, and a reflective layer 75 mounted on the insulating layer 71 and located between the circuit 73 and the LED crystals 72. In such a manner, the non-metallic heatsink layer 2 has a porous structure so that the air contained in the hollow receiving space 4 can pass through the non-metallic heatsink layer 2 to produce a heat convection effect. Thus, the heat produced by the LED crystals 72 is conducted quickly and distributed evenly on the metallic heat conducting layer 1 to form an evenly heat conducting effect. At the same time, the hollow receiving space 4 has a heat convection effect to quickly transfer the heat on the metallic heat conducting layer 1 to the non-metallic heatsink layer 2 which produces a heatsink effect to dissipate the heat so that the heat produced by the LED crystals 72 is dissipated quickly by provision of the metallic heat conducting layer 1, the hollow receiving space 4 and the non-metallic heatsink layer 2. In addition, the light produced by the LED crystals 72 is reflected by the reflective layer 75 to enhance the heat dissipation efficiency.

Figure 16:
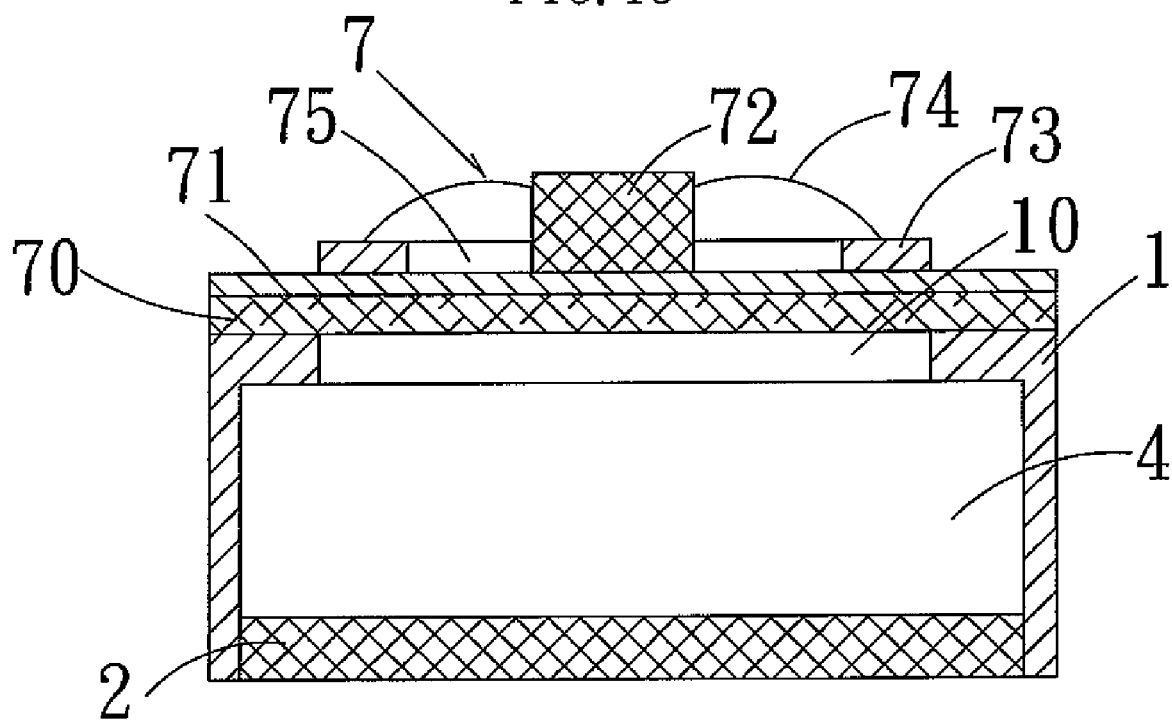
FIG. 16 is a front cross-sectional assembly view of a heat sink in accordance with another preferred embodiment of the present invention.

Referring to FIG. 16, the metallic heat conducting layer 1 has a side provided with a connecting hole 10 connected to the substrate 70 of the LED module 7 to connect the hollow receiving space 4 to the substrate 70 of the LED module 7 to enhance the heat dissipation efficiency.

Accordingly, the heat produced by the heat source (A) is conducted quickly and distributed evenly on the metallic heat conducting layer 1 to form an evenly heat conducting effect, while the hollow receiving space 4 has a heat convection effect to quickly transfer the heat on the metallic heat conducting layer 1 to the non-metallic heatsink layer 2 which produces a heatsink effect to dissipate the heat so that the heat produced by the heat source (A) is dissipated quickly by provision of the metallic heat conducting layer 1, the hollow receiving space 4 and the non-metallic heatsink layer 2.

Although the invention has been explained in relation to its preferred embodiment(s) as mentioned above, it is to be understood that many other possible modifications and variations can be made without departing from the scope of the present invention. It is, therefore, contemplated that the appended claim or claims will cover such modifications and variations that fall within the true scope of the invention.

The invention claimed is:

1. A heat sink, comprising:
    a metallic heat conducting layer;
    a non-metallic heatsink layer combined with the metallic heat conducting layer;
    a hollow receiving space defined between the metallic heat conducting layer and the non-metallic heatsink layer;
    wherein the non-metallic heatsink layer is primarily made of non-metallic material;
    the non-metallic heatsink layer has a porous structure connected to the hollow receiving space;
    the hollow receiving space is formed by the metallic heat conducting layer;
    the metallic heat conducting layer has a hollow inside defining the hollow receiving space and has open end for mounting the non-metallic heatsink layer;
    the hollow receiving space has an open end sealed by the non-metallic heatsink layer;
    the non-metallic heatsink layer is fully hidden in the hollow receiving space;
    the non-metallic heatsink layer is fully hidden in and flush with the open end of the metallic heat conducting layer.

2. The heat sink in accordance with claim 1, wherein
    the hollow receiving space is formed by the non-metallic heatsink layer;
    the non-metallic heatsink layer has a hollow inside defining the hollow receiving space and has an open end for mounting the metallic heat conducting layer;
    the hollow receiving space has an open end sealed by the metallic heat conducting layer;
    the hollow receiving space is sealed completely by the metallic heat conducting layer and the non-metallic heatsink layer.

3. A heat sink, comprising:
    a metallic heat conducting layer;
    a non-metallic heatsink layer combined with the metallic heat conducting layer;

a hollow receiving space defined between the metallic heat conducting layer and the non-metallic heatsink layer;

wherein the non-metallic heatsink layer is primarily made of non-metallic material;

the non-metallic heatsink layer has a porous structure connected to the hollow receiving space;

the heat sink further comprises a packing layer mounted between the metallic heat conducting layer and the non-metallic heatsink layer;

the metallic heat conducting layer is spaced from the non-metallic heatsink layer by the packing layer;

the hollow receiving space is formed by the packing layer;

the packing layer has a hollow inside defining the hollow receiving space and has an open first end for mounting the metallic heat conducting layer and an open second end for mounting the non-metallic heatsink layer;

the metallic heat conducting layer is fully hidden in and flush with the open first end of the packing layer;

the non-metallic heatsink layer is fully hidden in and flush with the open second end of the packing layer;

the hollow receiving space has two open ends sealed by the metallic heat conducting layer and the non-metallic heatsink layer respectively.

4. The heat sink in accordance with claim 1, wherein the non-metallic heatsink layer has a high porous structure and contains non-metallic powders having greater heat conductivity;

the non-metallic heatsink layer has a porosity ranged between 20% and 80%;

the non-metallic powders have different diameters ranged between 20 μm and 200 μm.

5. The heat sink in accordance with claim 4, wherein the non-metallic powders are mixed with metallic powders having greater heat conductivity to form composite powders having different diameters ranged between 50 μm and 500 μm.

6. The heat sink in accordance with claim 1, wherein the non-metallic heatsink layer has a three-dimensional heat dissipation face which has a predetermined shape and has a matrix arrangement.

7. The heat sink in accordance with claim 1, further comprising a three-dimensional dot-matrix heatsink layer mounted on a surface of the non-metallic heatsink layer and arranged in an irregular manner.

8. The heat sink in accordance with claim 1, further comprising a three-dimensional dot-matrix heatsink layer mounted on a surface of the non-metallic heatsink layer and arranged in a regular manner.

9. The heat sink in accordance with claim 1, further comprising a secondary non-metallic heatsink layer mounted in the hollow receiving space and located between the metallic heat conducting layer and the non-metallic heatsink layer.

10. The heat sink in accordance with claim 9, wherein the secondary non-metallic heatsink layer has a three-dimensional heatsink structure and includes a plurality of skeletons each having a greater heat conductivity and each having an inside provided with a conduit;

the conduits of the skeletons of the secondary non-metallic heatsink layer are connected to each other.

11. The heat sink in accordance with claim 9, wherein the non-metallic heatsink layer is located at a bottom of the secondary non-metallic heatsink layer.

12. The heat sink in accordance with claim 1, further comprising an insulating layer mounted on a surface of the metallic heat conducting layer;

a circuit mounted on the insulating layer;

a plurality of LED (light emitting diode) crystals mounted on the insulating layer;

a plurality of conducting wires connected between the circuit and the LED crystals.

13. The heat sink in accordance with claim 12, further comprising a reflective layer mounted on the insulating layer and located between the circuit and the LED crystals.

14. The heat sink in accordance with claim 1, further comprising an LED module mounted on a surface of the metallic heat conducting layer, wherein the LED module includes a substrate mounted on the surface of the metallic heat conducting layer;

an insulating layer mounted on the substrate;

a circuit mounted on the insulating layer;

a plurality of LED crystals mounted on the insulating layer;

a plurality of conducting wires connected between the circuit and the LED crystals.

15. The heat sink in accordance with claim 14, wherein the LED module further includes a reflective layer mounted on the insulating layer and located between the circuit and the LED crystals.

16. The heat sink in accordance with claim 14, wherein the metallic heat conducting layer has a side provided with a connecting hole connected to the substrate of the LED module to connect the hollow receiving space to the substrate of the LED module.

17. The heat sink in accordance with claim 7, wherein the three-dimensional dot-matrix heatsink layer and the non-metallic heatsink layer are made of the same material.

18. The heat sink in accordance with claim 8, wherein the three-dimensional dot-matrix heatsink layer and the non-metallic heatsink layer are made of the same material.

* * * * *